(12) United States Patent
Oh

(10) Patent No.: US 6,765,976 B1
(45) Date of Patent: Jul. 20, 2004

(54) DELAY-LOCKED LOOP FOR DIFFERENTIAL CLOCK SIGNALS

(75) Inventor: Jong-Hoon Oh, Fremont, CA (US)

(73) Assignee: G-Link Technology, Santa Clara, CA (US)

( * ) Notice: Subject to any disclaimer, the term of this patent is extended or adjusted under 35 U.S.C. 154(b) by 603 days.

(21) Appl. No.: 09/660,860

(22) Filed: Sep. 13, 2000

Related U.S. Application Data

(60) Provisional application No. 60/193,058, filed on Mar. 29, 2000.

(51) Int. Cl.[7] .............................................. H03L 7/06
(52) U.S. Cl. ........................ 375/376; 327/156; 327/159; 327/158; 327/237; 327/149; 375/371; 375/358; 375/373
(58) Field of Search ................................ 327/158, 156, 327/159, 237, 149; 375/371, 358, 373

(56) References Cited

U.S. PATENT DOCUMENTS

| | | | | |
|---|---|---|---|---|
| 5,440,514 A | | 8/1995 | Flannagan et al. ........... 365/194 |
| 5,463,337 A | | 10/1995 | Leonowich .................. 327/158 |
| 5,610,543 A | | 3/1997 | Chang et al. ................ 327/158 |
| 5,796,673 A | | 8/1998 | Foss et al. .................. 365/233 |
| 5,808,498 A | * | 9/1998 | Donnelly et al. ............ 327/255 |
| 5,923,613 A | * | 7/1999 | Tien et al. ................... 365/233 |
| 5,945,862 A | * | 8/1999 | Donnelly et al. ............ 327/278 |
| 5,969,552 A | | 10/1999 | Lee et al. .................... 327/158 |
| 5,999,032 A | * | 12/1999 | Wang et al. ................. 327/292 |
| 6,043,694 A | * | 3/2000 | Dortu .......................... 327/156 |
| 6,101,137 A | | 8/2000 | Roh ............................ 365/194 |
| 6,127,866 A | | 10/2000 | Chu et al. .................... 327/158 |
| 6,205,191 B1 | * | 3/2001 | Portmann et al. ........... 375/354 |
| 6,265,903 B1 | * | 7/2001 | Takahashi ...................... 327/7 |
| 6,285,625 B1 | * | 9/2001 | Vogley ........................ 365/233 |
| 6,539,072 B1 | * | 3/2003 | Donnelly et al. ............ 375/371 |

* cited by examiner

*Primary Examiner*—Stephen Chin
*Assistant Examiner*—Sudhanshu C. Pathak
(74) *Attorney, Agent, or Firm*—Townsend and Townsend and Crew LLP

(57) ABSTRACT

A significantly more efficient implementation of a DLL for systems using two separate clock signals, whereby a single DLL circuit is used to provide for locking of both clock signals. According to the present invention, the input to the DLL is controlled such that it responds to edges of both clock signals. The present invention provides a circuit receiving a first periodic signal CLK1 and a second periodic signal CLK2, there being a phase difference between CLK1 and CLK2, the circuit including a delay-locked loop (DLL) having one delay path, wherein the same delay path provides delay tuning for both CLK1 and CLK2.

29 Claims, 8 Drawing Sheets

DELAY-LOCKED LOOP FOR DIFFERENTIAL CLOCK SIGNALS

CROSS-REFERENCES TO RELATED APPLICATIONS

This invention derives priority from U.S. provisional patent application No. 60/193,058, titled "Delay Locked Loop for Differential Clock Signals," filed Mar. 29, 2000, which is incorporated herein in its entirety.

BACKGROUND OF THE INVENTION

The present invention relates in general to integrated circuits, and in particular to methods and circuitry for implementing delay-locking for two separate periodic signals using a single delay-locked loop circuit.

Delay-locked loops (DLLs) are commonly employed to generate a "clean" internal clock signal from a noisy external clock signal. Among the factors by which the performance of a DLL is typically measured are the speed of operation (i.e., the minimum number of locking cycles), jitter, the size of the circuit and power consumption. There has been a need for more efficient implementation of DLLs as operating speeds of modern integrated circuits have increased. Some circuit applications require the use of two separate clock signals. For example, the so called double data rate (DDR) or quad data rate (QDR) synchronous dynamic random access memory (SDRAM) system uses a differential pair of clock signals, CLK and CLK#, to process data. These types of circuits have conventionally used two separate DLLs for the two clock signals. This implementation results in increased overall circuit size and power consumption, therefore increasing the cost of the device.

SUMMARY OF THE INVENTION

The present invention provides a significantly more efficient implementation of a DLL for systems using two separate clock signals, whereby a single DLL circuit is used to provide for locking of both clock signals. According to the present invention, the input to the DLL is controlled such that it responds to edges of both clock signals.

Accordingly, in one embodiment, the present invention provides a circuit receiving a first periodic signal CLK1 and a second periodic signal CLK2, there being a phase difference between CLK1 and CLK2, the circuit including a DLL having one delay path, wherein the same delay path provides delay tuning for both CLK1 and CLK2.

In another embodiment, the present invention provides a method of tuning the delay of two out-of-phase periodic signals, CLK1 and CLK2, including: combining CLK1 and CLK2 to generate a first periodic signal C_IN1 with a rising edge determined by CLK1 and a falling edge determined by CLK2; and applying C_IN1 to a DLL having a delay path that substantially maintains the duty ratio of C_IN1, whereby the delay-locked loop generates output signals that are delay-tuned to CLK1 and CLK2.

A better understanding of the nature and advantages of the present invention may be gained with reference to the following detailed description and the accompanying drawings.

DETAILED DESCRIPTION OF THE SPECIFIC EMBODIMENTS

The present invention provides a significantly more efficient implementation of a DLL for systems using two separate clock signals, CLK1 and CLK2, whereby a single DLL circuit is used to provide for locking of both clock signals. As stated above, the input to the DLL is controlled such that it responds to edges of both clock signals. For example, in one embodiment, the input signal to the DLL is set by the rising edge of CLK1 and reset by the rising edge of CLK2. Thus, in this example, the input pulse to the DLL represents the positive edges of both clock signals CLK1 and CLK2.

Figure 1:
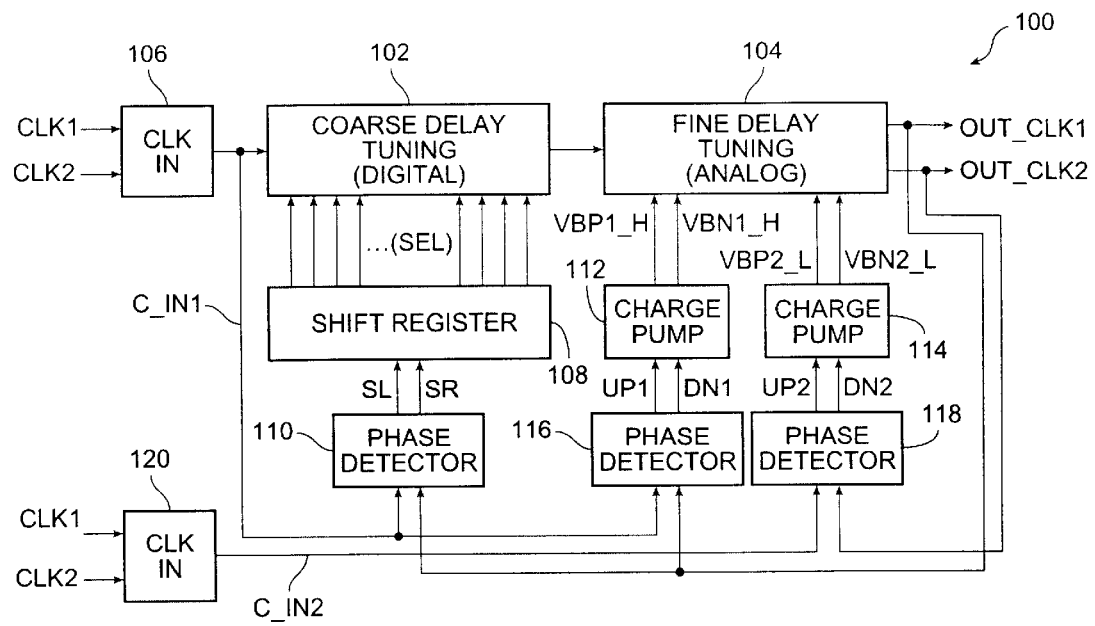
FIG. 1 shows a simplified block diagram of circuitry according to one embodiment of the present invention.
Figure 2:
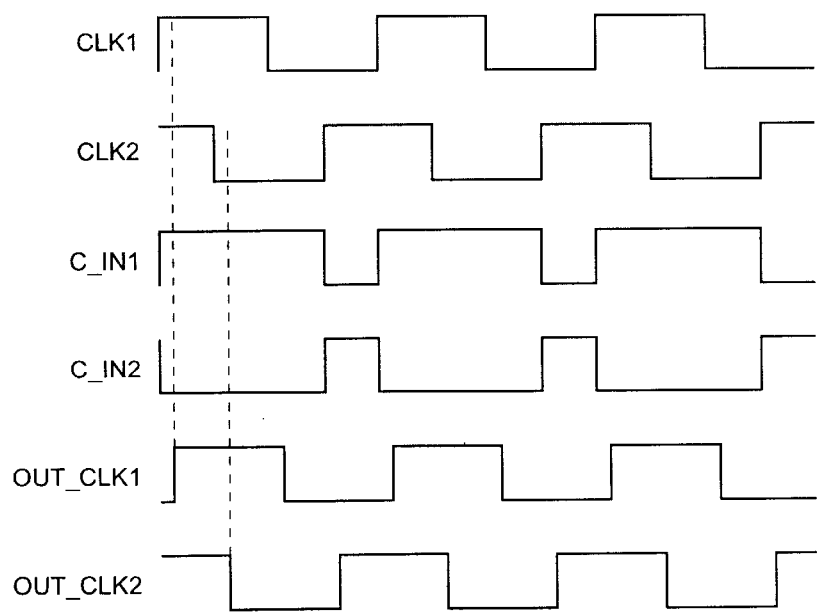
FIG. 2 is a timing diagram illustrating the operation of the circuit of FIG. 1.

In a specific embodiment shown in FIG. 1, a DLL circuit 100 according to the present invention includes a coarse delay tuning block 102 that is followed by a fine delay tuning block 104. A clock input circuit CLK IN 106 receives the two clock signals, CLK1 and CLK2, and generates a signal C_IN1 that transitions in response to selected edges of each of CLK1 and CLK2. For example, CLK IN 106 can be designed to generate signal C_IN1 that is set by the rising edge of CLK1 and reset by the rising edge of CLK2, as shown in FIG. 2.

In one embodiment, CLK1 and CLK2 form a differential clock signal where CLK2 is approximately 180 degrees out of phase with respect to (i.e., is the inverse of) CLK1. It is to be understood, however, that the technique of the present invention works with any two periodic signals that have a phase difference (i.e., the phase difference between the two need not necessarily be 180 degrees). Referring again to FIG. 2, the phase difference between CLK1 and CLK2 is 90 degrees in one embodiment.

Turning again to FIG. 1, a coarse delay tuning block 102 is implemented by a serial chain of delay cells that are controlled and adjusted by a shift register 108 having, in one embodiment, 16 outputs SEL0 through SEL15. A phase detector (PD) 110 compares the delay of an output signal OUT_CLK1 with that of input signal C_IN1 and generates a control signal to the shift register, shift left (SL) or shift right (SR).

In keeping with the invention, the fine delay tuning block 104 includes a series of unit delay cells, the delay of which is controlled by charge pump circuits 112 and 114. The charge pump circuits 112 and 114 are in turn controlled by the PD circuits 116 and 118. The PD 116 compares the delay of the input signal C_IN1 with that of the output signal OUT_CLK1, while the PD 118 compares the delay of the input signal C_IN2 with that of the output signal OUT_CLK2. A second clock input circuit CLK IN 120 generates C_IN2 by, for example, setting C_IN2 in response to the rising edge of CLK2 and resetting C_IN2 in response to the rising edge of CLK1. It should be noted that if CLK2 is the complement of CLK1 then C_IN2 can be generated by setting C_IN2 in response to the falling edge of CLK1 and resetting C_IN2 in response to the falling edge of CLK2.

In operation, during an initialization cycle, it is the coarse delay tuning block 102 that is primarily operative. In this example, the rising edges of CLK1 and CLK2 are processed. It is to be understood, however, that a similar circuit can be implemented using the falling edges of the two clock signals or any combination of rising and falling edges of CLK1 and CLK2.

The coarse delay tuning block 102 provides for an initial coarse delay tuning between the rising edge of CLK1 and OUT_CLK1. The PD 110 compares the delays in these two signals and controls the shift register such that a logic high, or logic "1", for example is shifted one register to the left when SL is asserted (e.g., increasing the overall delay) or to the right when SR is asserted (e.g., decreasing the overall delay). No course delay tuning occurs when neither SL nor SR are asserted. The overall delay path is designed to maintain the duty ratio of the input signal as it propagates through the path such that it exhibits substantially the same duty ratio at the output. Since the falling edge of C_IN1 is controlled by CLK2, and the duty ratio is maintained through the delay path, the same delay path effectively tunes the delay of CLK2.

Figure 3:
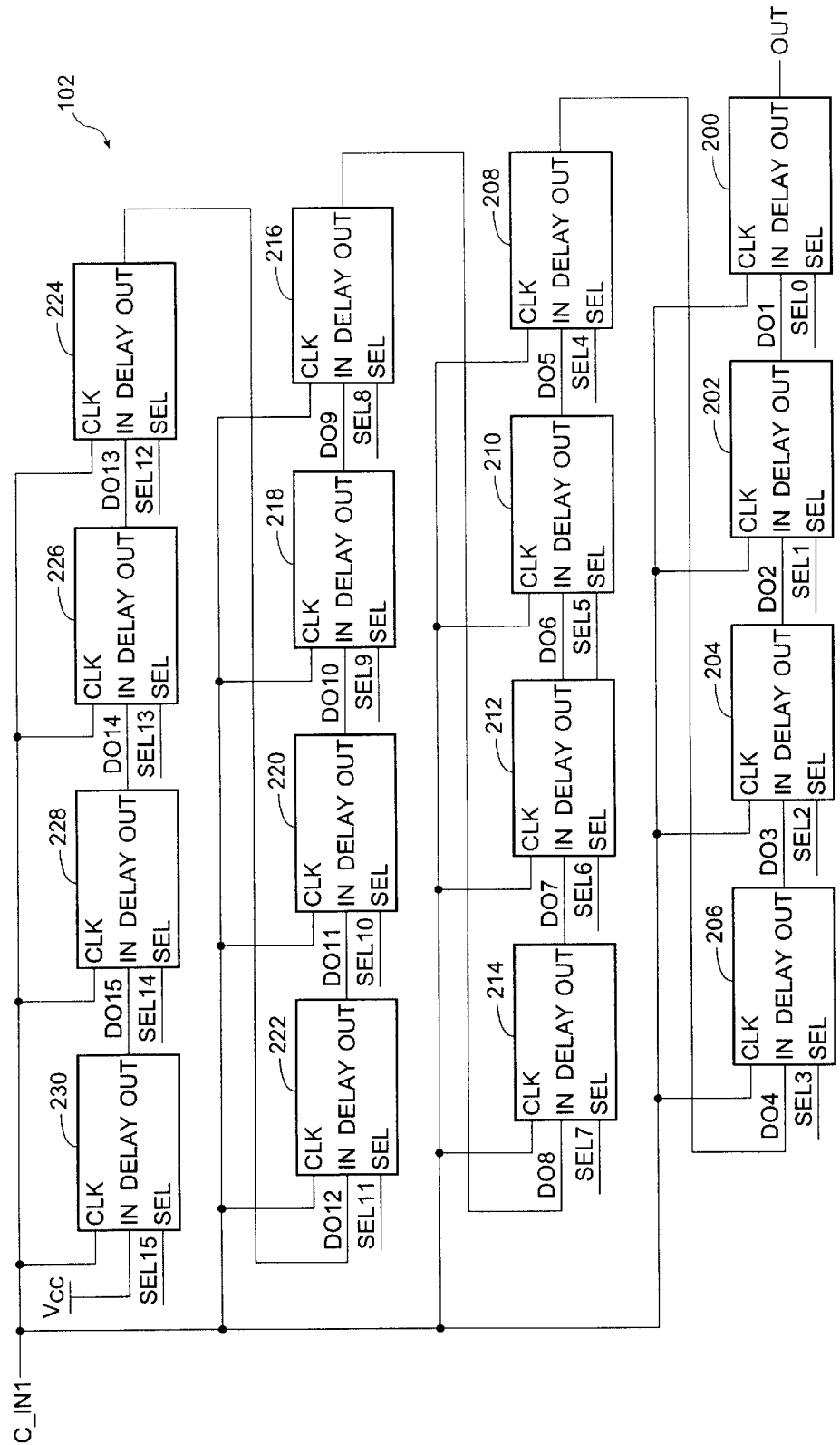
FIG. 3 is an exemplary implementation of a delay tuning block of FIG. 1.

Referring to FIG. 3, an exemplary 16-cell delay chain implements coarse (or digital) delay tuning block 102. The 16 cells are respectively indicated by even reference numerals 200 through 230, each of which contributes one delay unit. Each cell has an input labeled CLK that is tied to C_IN1. Each cell further has an input labeled IN and an output labeled OUT, wherein the input of one cell is tied to the output of the adjacent cell. The exception to this is that the input to the first cell 230 is tied to a logic high signal (Vcc) and the output of the cell 200 leads to the fine delay tuning block 104 (FIG. 1).

In further keeping with the invention, the shift register 108 (FIG. 1) has 16 output lines, SEL0 through SEL15, in one embodiment. Shift registers are known to those of skill in the art and therefore a discussion of the internal architecture will not ensue.

Referring to FIGS. 1 and 3, SEL0 through SEL15 feed the select (SEL) inputs of digital delay cells 200 through 230, respectively. In one embodiment, SEL7 is initially in a high state and the other 15 select lines are initially in low states. The effect of a given select line, say SEL7, being in a logic high state is that the cells with select lines having higher numbers, in this case SEL8 through SEL15, are bypassed. Therefore, when SEL7 is in a high state, only SEL0 through SEL7 contribute toward the delay. Consequently, the delay is eight units long (each unit being equal to the delay of a single delay cell) when SEL7 is asserted.

A shift to the left or right is executed when SL or SR, respectively, is asserted. In other words, asserting SL causes SEL8 to go high and SEL7 to go low. Therefore, a pulse at the SL input to the shift register 108 causes a shift to the left, effectively increasing the delay through the course delay tuning block 102 by one delay unit. Conversely, a pulse at the SR input to the shift register causes a shift to the right, effectively decreasing the delay through the course delay tuning block by one delay unit.

Figure 4:
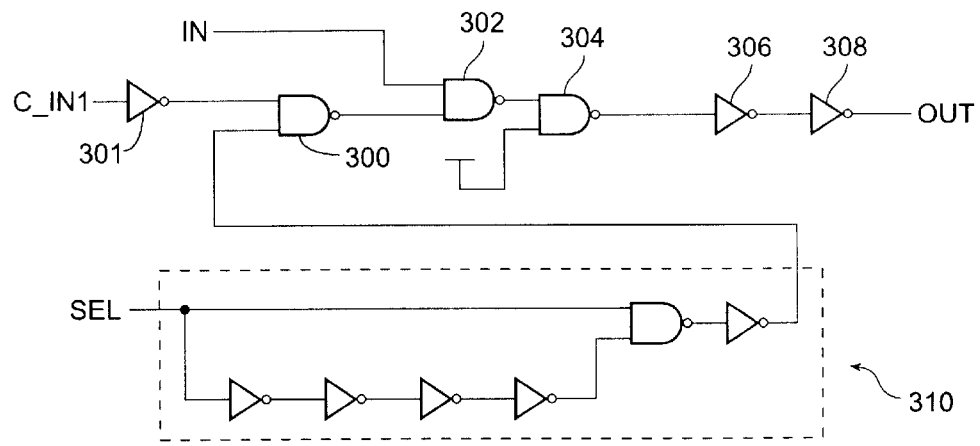
FIG. 4 depicts an exemplary implementation of each delay cell used in a delay chain of FIG. 3.

FIG. 4 depicts an exemplary circuit implementation for each delay cell used in the delay chain of FIG. 3. The delay cell of FIG. 4 is especially designed such that it will ensure the matching of the delay for both the falling edge and the rising edge of the signal it propagates in order to maintain the duty ratio of the signal. The circuitry includes an inverter 301, a NAND gate 300, a NAND gate 302, a NAND gate 304, an inverter 306 and an inverter 308. The output of the inverter 308 is the output of the particular delay cell. The inputs to the NAND gate 300 are C_IN1 and the select input of the corresponding delay cell, e.g., SEL7. It is envisioned that the signal at the select input can propagate through optional circuitry 310 that serves to filter glitches.

Figure 5:
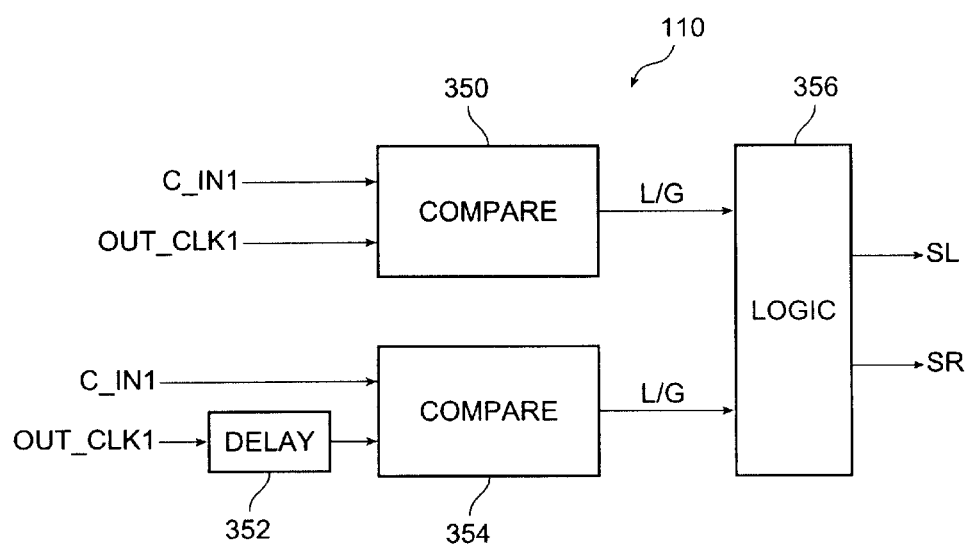
FIG. 5 is a block diagram of a phase detector of FIG. 1.

Referring to FIG. 5, the PD 110 is depicted in somewhat greater detail. The PD 110, using a first compare block 350, compares C_IN1 to OUT_CLK1 to check for a lead or a lag (L/G). The PD 110 implements a digital delay cell 352, identical to the delay cells of FIG. 3, to do a second comparison via a second compare block 354. The second comparison is made between C_IN1 and OUT_CLK1, wherein OUT_CLK1 is delayed by one delay unit (i.e., the propagation delay of the digital delay cell 352). The circuitry again checks for a lead or a lag (L/G). The outputs of the first compare block and the second compare block are fed to the logic block 356. The logic block 356 determines, depending upon the indication of a lead or a lag from the outputs of the compare blocks 350 and 354, whether a shift to the left or the right should be performed. SL and SR are in turn output from the logic block 356. The logic block 356 will appropriately set either SL or SR to be a logic high. However, the lead or lag must be equal in time to at least one delay unit in order for either SL or SR to be set. Otherwise, both SL and SR are both set to logic low indicating that a coarse lock has been achieved, after which the shift register 108 remains static and coarse delay tuning is stopped.

Turning again to FIG. 1, once the coarse delay tuning block 102 achieves a coarse lock between the two inputs of the PD 110 within its window (e.g., within one digital unit delay) or reaches either boundary (e.g., one or 16 for a 16-cell delay chain), fine (or analog) delay tuning block 104 takes over. The remaining phase difference between the input signal C_IN1 and the feedback output signal OUT_CLK1 is measured by the PD 116 which in turn controls the charge pump 112.

In this embodiment, a second PD 118 compares the second output OUT_CLK2 with a signal C_IN2 which is essentially the inverse of C_IN1. The signal C_IN2 is generated by the clock input circuit CLK IN 120 and is set by the rising edge of CLK2 and reset by the rising edge of CLK1 (the opposite of C_IN1). Again, we note that if CLK2 is the complement of CLK1 then C_IN2 can be generated by setting C_IN2 by the falling edge of CLK1 and resetting C_IN2 by the falling edge of CLK2. The PD 118 controls the charge pump 114. The charge pumps 112 and 114 control the amount of current flowing through (and therefore the delay of) the analog delay cells within the fine delay tuning block 104.

Figure 6:
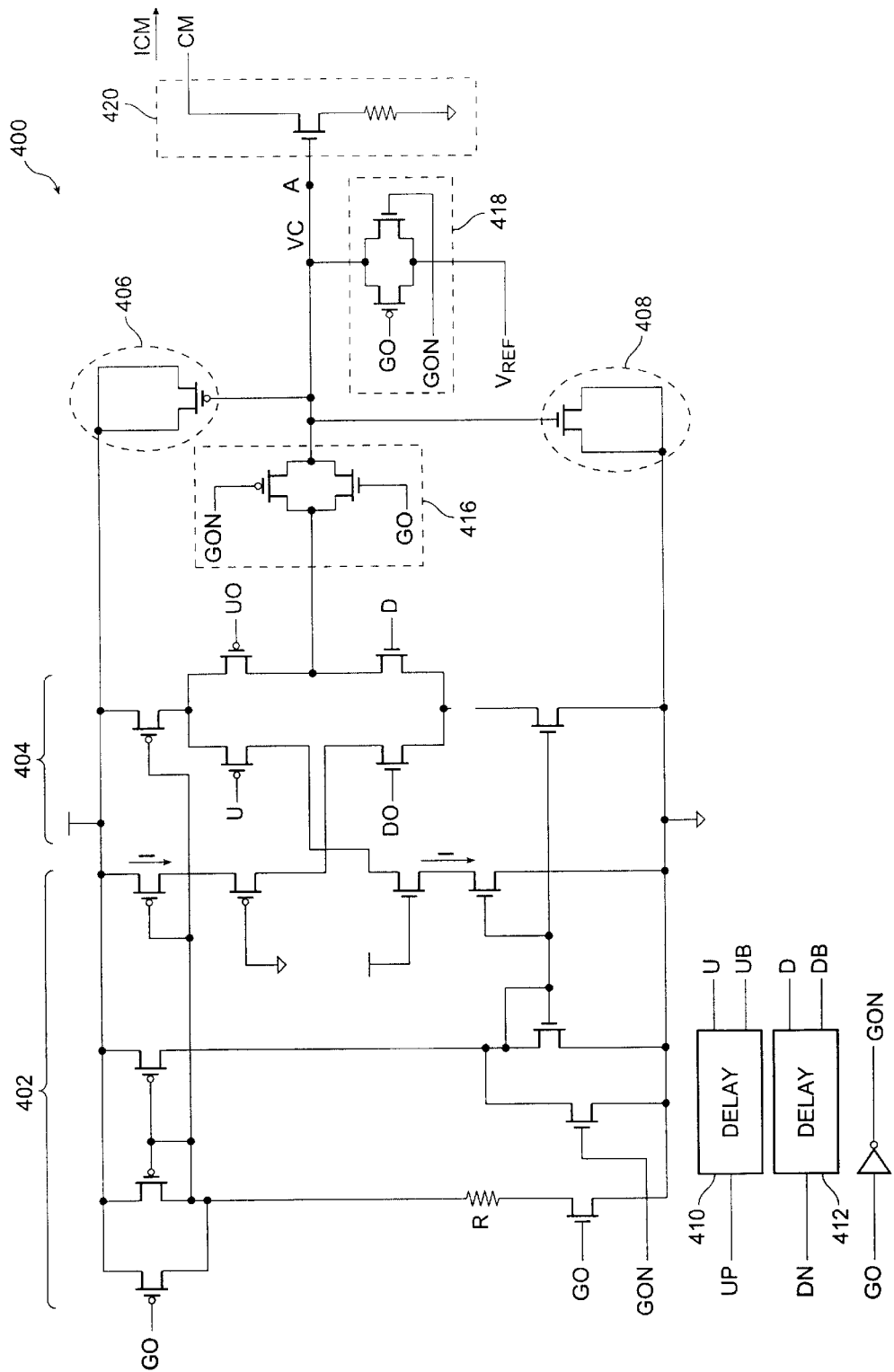
FIG. 6 shows an exemplary implementation of a portion of a charge pump of FIG. 1.

FIG. 6 shows an exemplary circuit implementation 400 of a portion of the charge pump 112 (or a portion of the charge pump 114). The entirety of the charge pump is illustrated except for the current mirror output stage, which will be described below in connection with FIG. 7.

The charge pump circuit 400 includes a constant current generator 402 that supplies current I to a current switching network of transistors 404. The current switching network 404 controls the supply of charge to the charge pump capacitors 406, 408. Referring also to FIG. 1, the switches in the network 404 are controlled by the UP and DN signals generated by the PD circuit 116 (which outputs UP1 and DN1) and the PD circuit 118 (which outputs UP2 and DN2). The UP and DN signals are respectively passed through circuits 410, 412 to produce differential signals U/UB and D/DB.

The signals GO and GON are used to control the activation of the fine delay tuning circuit 104. When the course delay tuning 102 is operating and the fine delay tuning 104 is to be off, GO is a logic low and GON is a logic high, turning off the switch 416 and thus disconnecting the circuit 404 from the node A. Similarly, the NMOS transistor of the switch 418 turns on and the PMOS transistor of the switch 418 turns on. This action closes the switch 418. The switch 418 thus initializes the node A to a constant voltage $V_{ref}$, thereby setting a constant delay through the fine delay tuning block 104. Consequently, when GO is low course delay tuning is active and fine delay tuning is inactive.

Conversely, when GO is a logic high and GON is a logic low the NMOS transistor of the switch 416 is on and the PMOS transistor of the switch 416 is on. This closes the switch 416. Similarly, the NMOS transistor of the switch 418 turns off and the PMOS transistor of the switch 418 turns off. This action opens the switch 418. The current ICM then changes in response to changes in UP1 and DN1 (or UP2 and DN2). Consequently, when GO is high course delay tuning is inactive and fine delay tuning is active. In other words, GO enables the charge pump circuit 400 when the coarse delay tuning is complete and fine delay tuning is to ensue.

The circuitry 420 coverts the voltage at node A into a current ICM. The purpose of converting the voltage signal into a current signal is so that the signal can be sent a long distance while minimizing the impact of parasitics that give rise to jitter noise on a voltage signal. This conversion may be necessary if the charge pump circuitry is located far away on the die from the fine delay tuning circuit, and is therefore optional.

Figure 7:
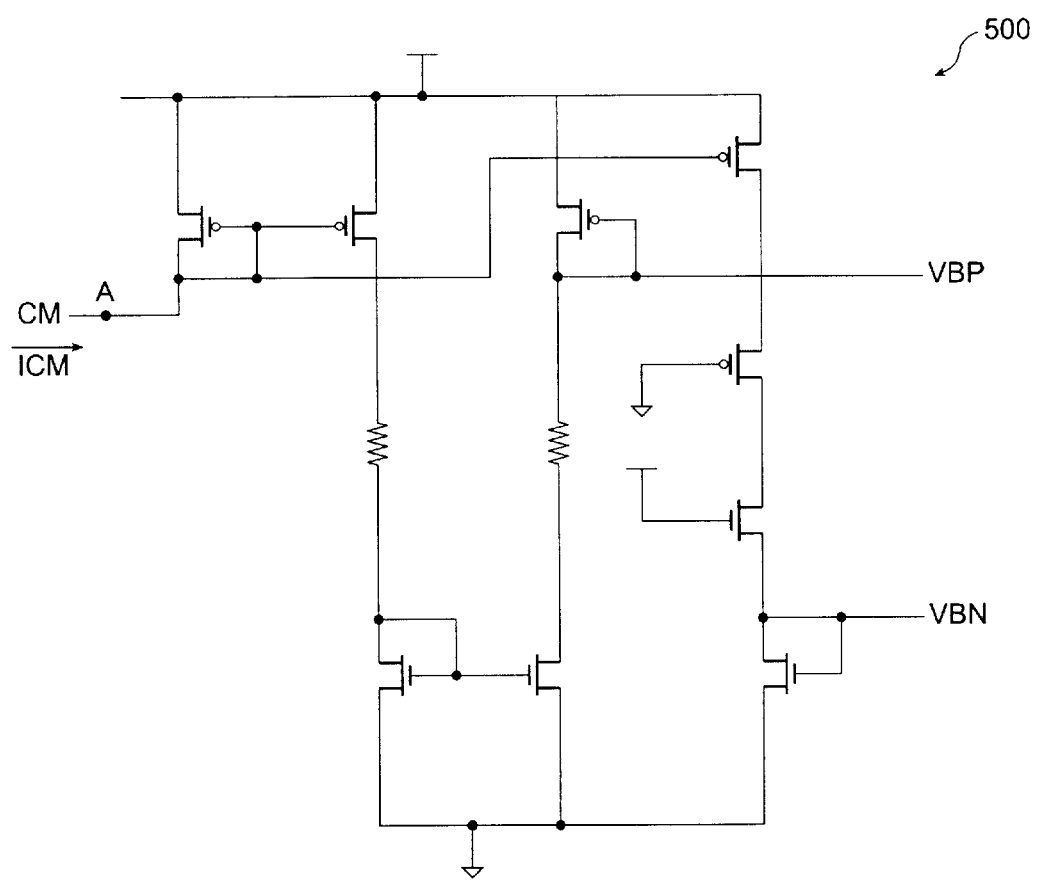
FIG. 7 illustrates an exemplary implementation for an output stage of a charge pump of the present invention.

Referring now to FIGS. 1 and 7, the output ICM of the circuit of FIG. 6 is supplied to a current mirror circuit 500. The circuitry 400 of FIG. 6 together with the circuitry 500 of FIG. 7 make up a charge pump 112 or 114. The current mirror circuit is the output stage of the charge pump 112 or 114. The purpose of the current mirror circuit is to convert the current ICM back to a differential voltage. The current mirror circuit generates the signals VBP_L and VBN_L (or VBP_H and VBN_H) that control the amount of current flow in individual analog delay cells in the fine delay tuning block 104.

Figure 8:
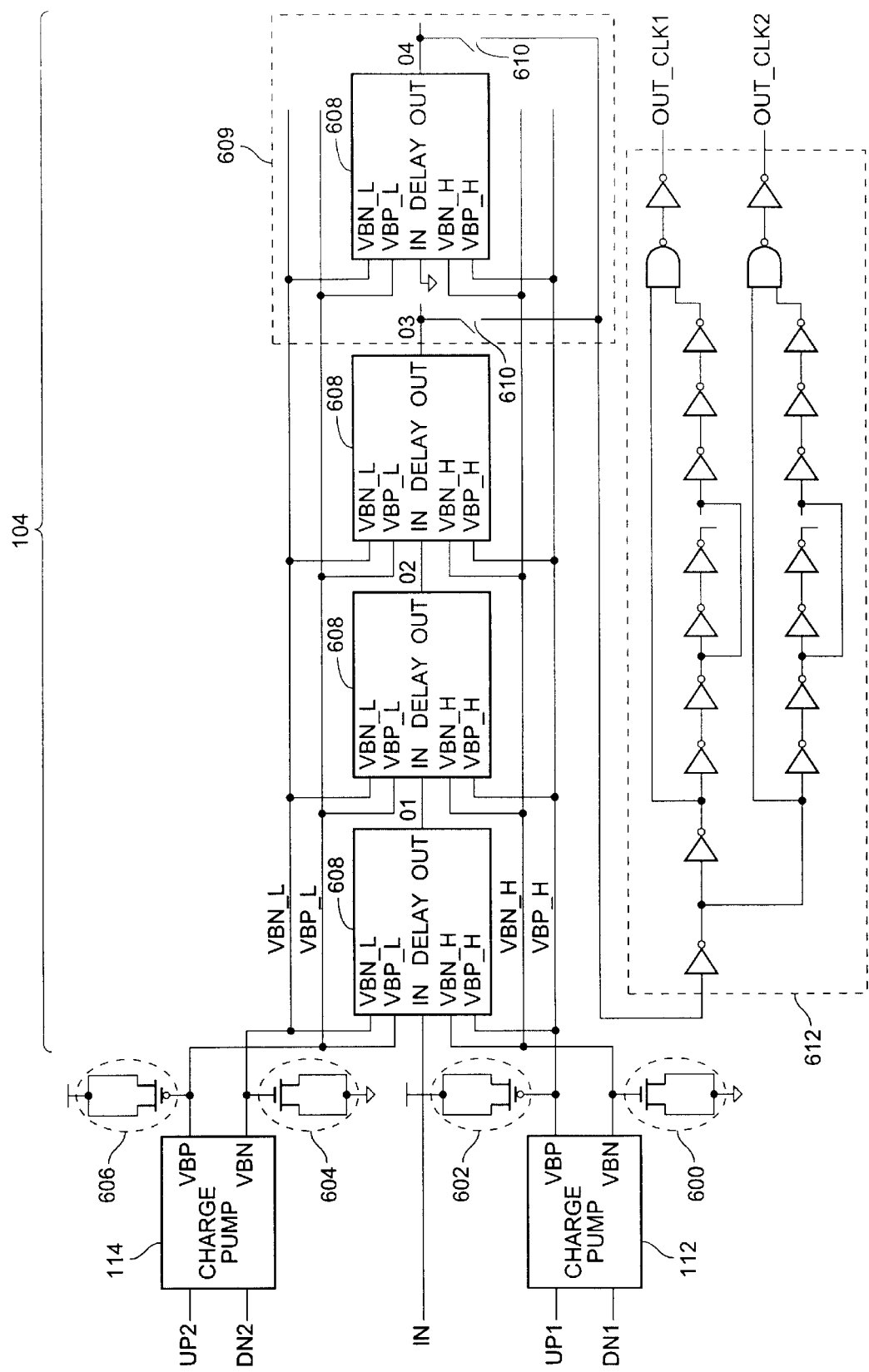
FIG. 8 shows an implementation of a fine delay tuning block of FIG. 1 according to an exemplary embodiment of the present invention.

Turning to FIG. 8, an exemplary implementation of the fine delay tuning 104 of FIG. 1 is depicted. The fine delay tuning circuitry is fed by the output of the charge pumps 112 and 114. The charge reserving capacitors 600, 602, 604, 606 can be included to set the frequency of the signals. A number of blocks of delay chains 608 each having, e.g., eight cells, are used. More delay chains can be optionally added as indicated by the dashed box 609 and the switches 610. The output stage of the fine delay tuning can be embodied in various ways such as the pulse generator 612. The output from the fine delay tuning, and from the delay-locked loop, consists of the signals OUT_CLK1 and OUT_CLK2.

Figure 9:
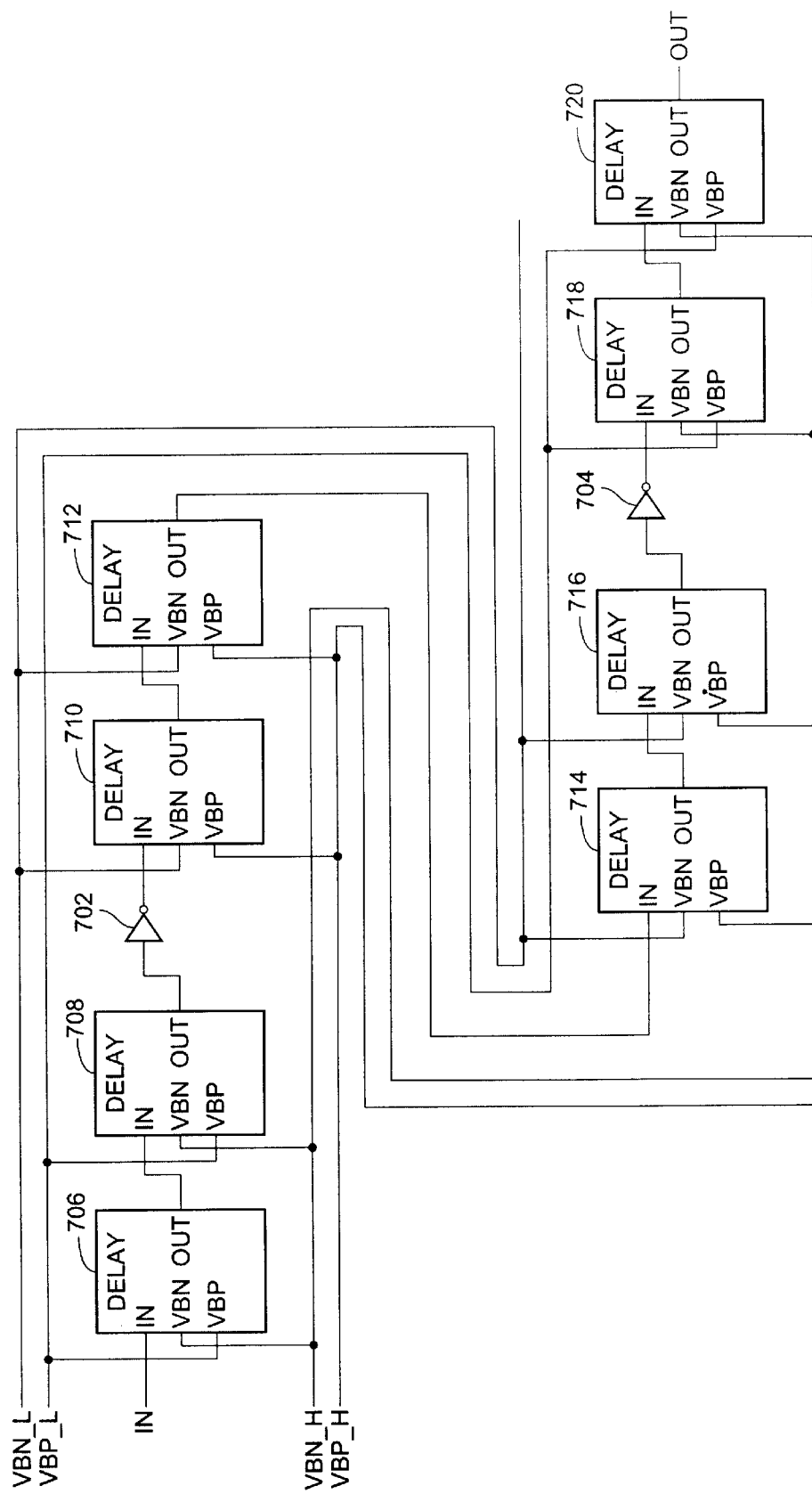
FIG. 9 is a circuit diagram of a delay block of FIG. 8 showing an exemplary eight-cell delay chain.
Figure 10:
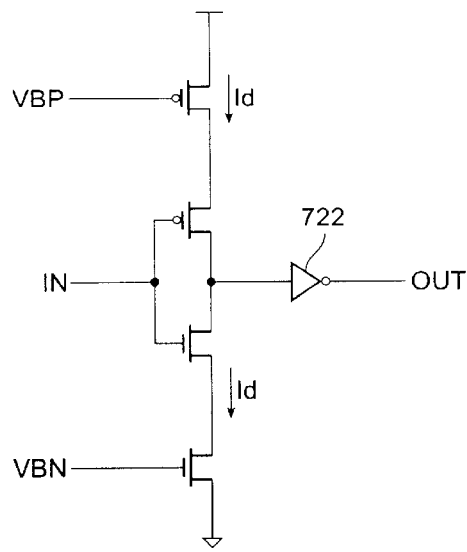
FIG. 10 is a more detailed circuit diagram of a delay cell depicted in FIG. 8.

An exemplary circuit implementation for the eight-cell delay chain is depicted in FIG. 9 with an exemplary circuit implementation for each cell shown in FIG. 10. The inverters 702 and 704 are located along the chain to ensure that both edges of the signal are similarly delayed. The delay cells 706 and 708 delay the rising edges. The delay cells 710, 712, 714 and 716 delay the falling edges. The delay cells 718 and 720 again delay the rising edges. Since both the rising edges and the falling edges of a given pulse are delayed by the same amount of time, the duty cycle is maintained constant.

Referring to FIG. 10, VBP is tied to the gate of a PMOS transistor. Consequently, the more negative the value of VBP the greater the current $I_d$. Conversely, VBN is tied to the gate of an NMOS transistor. Therefore, the more positive the value of VBN the greater the current $I_d$. A larger current $I_d$ causes the delay cell to switch more rapidly thus decreasing the delay. The inclusion of the inverter 722 is simply for keeping the value of the output positive when the input is positive and the value of the output negative when the input is negative.

Referring again to FIG. 2, OUT_CLK1 and OUT_CLK2 are produced and locked with CLK1 and CLK2, respectively. Importantly, the duty cycles have been maintained.

Figure 11:
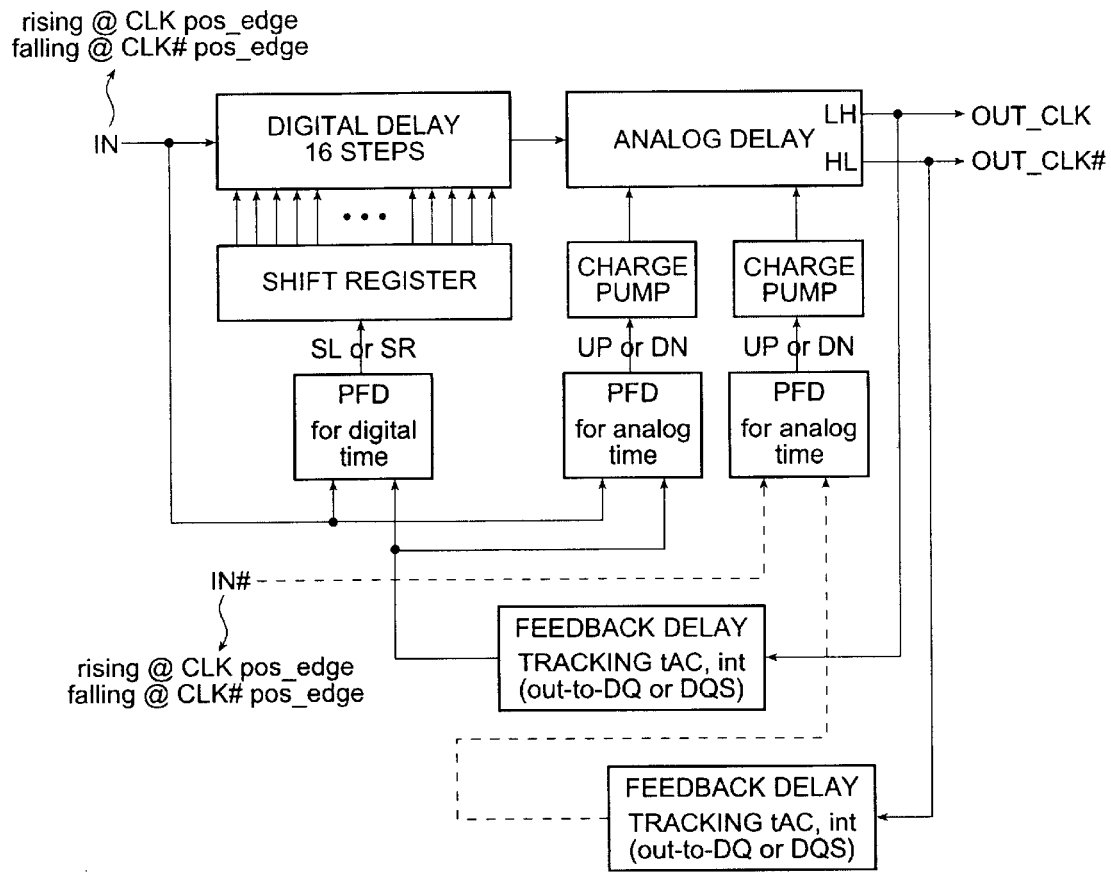
FIG. 11 shows a block diagram of a delay-locked loop according to one embodiment of the present invention.

In one embodiment, the DLL according to the present invention replaces two separate DLLs in a DDR or QDR SDRAM that operates with differential clock signals CLK and CLK#. In this embodiment, the single delay path DLL generates an output clock that synchronizes the switching of the memory I/O data DQ or the data strobe signal DQS with the rising edge of either CLK or CLK#. The present invention accomplishes this by incorporating tracking circuits into the DLL analog and digital loops to account for the memory access delay (tAC_in) from the output clock to DQ and DQS switching. FIG. 11 shows a block diagram of the DLL of the present invention with memory access time tracking delays incorporated into the loops.

In conclusion, the present invention provides methods and circuitry for implementing delay-locking for two separate periodic signals using a single delay-locked loop circuitry. The DLL includes a coarse delay tuning circuit that achieves a coarse lock at a higher speed, followed by a fine delay tuning circuit that achieves a fine lock at a slower speed. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A circuit receiving a first periodic signal CLK1 and a second periodic signal CLK2, there being a phase difference between CLK1 and CLK2, the circuit comprising a delay-locked loop (DLL) coupled to receive CLK1 and CLK2 and configured to generate periodic signals C_IN1 and C_IN2 such that:

C_IN1 makes a first transition in response to a rising edge of CLK1 and a second transition in response to a rising edge of CLK2, and C_IN2 makes a first transition in response to a rising edge of CLK2 and a second transition in response to a rising edge of CLK1, the DLL having one delay path, wherein the same delay path provides delay tuning for both CLK1 and CLK2.

2. The circuit of claim 1 wherein the DLL further has a delay tuning circuit that is coupled to receive C_IN1 and C_IN2 and to generate output signals OUT_CLK1 and OUT_CLK2, the delay tuning circuit having compare circuitry to compare a phase difference between C_IN1 and OUT_CLK1, and between C_IN2 and OUT_CLK2.

3. The circuit of claim 2 wherein the delay tuning circuit includes a coarse delay tuning stage and a fine delay tuning stage.

4. The circuit of claim 3 wherein the coarse delay tuning stage includes:
   a coarse delay tuning circuit;
   a shift register coupled to the coarse delay tuning circuit; and
   a phase detector coupled to the shift register.

5. The circuit of claim 4 wherein the coarse delay tuning circuit includes a plurality of delay cells.

6. The circuit of claim 5 wherein a delay cell of the coarse delay tuning circuit is a digital delay cell including:
   a NAND gate; and
   an inverter.

7. The circuit of claim 3 wherein the fine delay tuning stage includes:
   a fine delay tuning circuit;
   a charge pump coupled to the fine delay tuning circuit; and
   a phase detector coupled to the charge pump.

8. The circuit of claim 7 wherein the fine delay tuning circuit includes a plurality of delay cells.

9. The circuit of claim 8 wherein a delay cell of the fine delay tuning circuit is an analog delay cell including:
   a gate, the delay of which is controlled by the amount of current flowing therethrough.

10. The circuit of claim 8, further including logic to ensure that rising and falling edges of a signal propagating through the delay cells of the fine delay tuning circuit are delayed equally, whereby a substantially constant duty cycle of the signal is maintained.

11. The circuit of claim 1 wherein the DLL further has a phase detector, the phase detector comprising:
   a logic block;
   a first compare block connected to the logic block;
   a second compare block connected to the logic block; and
   a digital delay cell connected to the second compare block;
   wherein the first compare block receives an input clock signal and an output clock signal and outputs a signal to the logic block representing a lead or a lag,
   the second compare block receives the input clock signal and the output clock signal and outputs a signal to the logic block representing a lead or a lag, and
   wherein the logic block outputs a signal to a shift register.

12. A circuit receiving a first periodic signal CLK1 and a second periodic signal CLK2 there being a phase difference between CLK1 and CLK2, the circuit comprising a delay-locked loop (DLL) having:
   a first clock input circuit coupled to receive CLK1 and CLK2 and configured to generate a first periodic signal that is set by a first edge of CLK1 and reset by a first edge of CLK2;
   second clock input circuit coupled to receive CLK1 and CLK2 and configured to generate a second periodic signal that is set by a first edge of CLK2 and reset by a first edge of CLK1; and
   a delay path configured to process the first and second periodic signals.

13. The circuit of claim 12 wherein the delay path is configured to substantially maintain a duty ratio of the first and second periodic signals as they propagate through the delay path.

14. The circuit of claim 13 wherein the delay path includes a coarse delay tuning block and a fine delay tuning block.

15. The circuit of claim 13 wherein the circuit includes a synchronous memory circuit operating in response to a differential clock signal made of CLK1 and CLK2.

16. The circuit of claim 15 wherein feedback loops in the delay path include delay circuits configured to track memory access delay.

17. A method of tuning delay of two out-of-phase periodic signals, CLK1 and CLK2, the method comprising:
   combining CLK1 and CLK2 to generate a first periodic signal C_IN1 with a rising edge determined by CLK1 and a falling edge determined by CLK2; and
   applying C_IN1 to a delay-locked loop having a delay path that substantially maintains a duty ratio of C_IN1, whereby the delay-locked loop generates output signals, OUT_CLK1 and OUT_CLK2, that are delay-tuned to CLK1 and CLK2, respectively.

18. The method of claim 17, the method further comprising:
   combining CLK1 and CLK2 to generate a second periodic signal C_IN2 with a rising edge determined by CLK2 and a falling edge determined by CLK1; and
   applying C_IN2 to a delay-locked loop having a delay path that substantially maintains a duty ratio of signal C_IN2.

19. The method of claim 18, the method further comprising:
   performing delay tuning by applying C_IN1, C_IN2, OUT_CLK1 and OUT_CLK2 to delay tuning circuitry.

20. The method of claim 19 wherein performing delay tuning includes:
   performing coarse delay tuning; and
   performing fine delay tuning.

21. The method of claim 20 wherein performing coarse delay tuning includes:
   receiving C_IN1 and OUT_CLK1 into a first phase detector circuit;
   comparing the phase difference between C_IN1 and OUT_CLK1 via the first phase detector circuit; and
   adjusting the delay of C_IN1 depending upon the phase difference between C_IN1 and OUT_CLK1.

22. The method of claim 20 wherein performing fine delay tuning includes:
   receiving C_IN1 and OUT_CK1 into a second phase detector circuit;
   receiving C_IN2 and OUT_CK2 into a third phase detector circuit;
   comparing the phases of C_IN1 and OUT_CK1 via the second phase detector circuit;
   comparing the phases of C_IN2 and OUT_CK2 via the third phase detector circuit;
   adjusting the delay of OUT_CK1 depending upon the phase difference between C_IN1 and OUT_CK1; and
   adjusting the delay of OUT_CK2 depending upon the phase difference between C_IN2 and OUT_CK2.

23. An integrated circuit memory device comprising:
   a delay-locked loop (DLL) circuit coupled to receive two periodic signals CLK1 and CLK2 and configured to generate two periodic clock signals OUT_CLK1 and OUT_CLK2, the DLL circuit comprising one delay path configured to provide delay tuning both between OUT_CLK1 and CLK1 and between OUT_CLK2 and CLK2.

24. The integrated circuit memory device of claim 23 wherein the two external clock signals form a differential clock signal.

25. The integrated circuit memory device of claim 23 further comprising:
- an input clock circuit coupled to receive CLK1 and CLK2 and configured to generate periodic signals C_IN1 and C_IN2, wherein the signal C_IN1 makes a first transition in response to a rising edge of CLK1 and a second transition in response to a rising edge of CLK2, and the signal C_IN2 makes a first transition in response to a rising edge of CLK2 and a second transition in response to a rising edge of CLK1.

26. The integrated circuit memory device of claim 25 wherein the DLL further includes a delay tuning circuit that is coupled to receive C_IN1 and C_IN2 and to generate OUT_CLK1 and OUT_CLK2, the delay tuning circuit having compare circuitry to compare a phase difference between C_IN1 and OUT_CLK1, and between C_IN2 and OUT_CLK2.

27. The integrated circuit memory device of claim 23 wherein the DLL includes a coarse delay tuning stage and a fine delay tuning stage configured to provide the delay tuning.

28. The integrated circuit memory device of claim 27 wherein the coarse delay tuning stage includes:
- a coarse delay tuning circuit;
- a shift register coupled to the coarse delay tuning circuit; and
- a phase detector coupled to the shift register.

29. The integrated circuit memory device of claim 27 wherein the fine includes:
- a fine delay tuning circuit;
- a charge pump coupled to the fine delay tuning circuit; and
- a phase detector coupled to the charge pump.

* * * * *